(12) United States Patent
Wu et al.

(10) Patent No.: US 7,169,629 B2
(45) Date of Patent: Jan. 30, 2007

(54) VCSEL AND THE FABRICATION METHOD OF THE SAME

(75) Inventors: Yi-Tsuo Wu, Hsinchu (TW); Jyh-Shyang Wang, Hsinchu (TW); Kun-Fong Lin, Hsinchu (TW); Nikolai A. Maleev, Hsinchu (TW); Daniil Alexandrovich Livshits, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 204 days.

(21) Appl. No.: 10/777,759

(22) Filed: Feb. 13, 2004

(65) Prior Publication Data

US 2005/0074045 A1 Apr. 7, 2005

(30) Foreign Application Priority Data

Oct. 7, 2003 (TW) .............................. 92127846 A

(51) Int. Cl.
*H01L 21/00* (2006.01)
(52) U.S. Cl. ......................................... 438/22; 438/604

(58) Field of Classification Search ............ 438/22–47, 438/565–567, 592–606
See application file for complete search history.

(56) References Cited

U.S. PATENT DOCUMENTS

| 5,245,622 | A | | 9/1993 | Jewell et al. |
| 5,985,683 | A | * | 11/1999 | Jewell ......................... 438/22 |
| 6,618,414 | B1 | * | 9/2003 | Wasserbauer et al. ... 372/45.01 |
| 6,936,486 | B2 | * | 8/2005 | Cheng et al. .................. 438/22 |
| 6,993,055 | B2 | * | 1/2006 | Wang et al. ........... 372/46.013 |
| 2003/0091083 | A1 | * | 5/2003 | Hwang et al. ................ 372/46 |
| 2004/0096996 | A1 | * | 5/2004 | Cheng et al. .................. 438/22 |
| 2005/0087753 | A1 | * | 4/2005 | D'Evelyn et al. ............. 257/98 |

* cited by examiner

*Primary Examiner*—Savitri Mulpuri
(74) *Attorney, Agent, or Firm*—Birch, Stewart, Kolasch and Birch, LLP

(57) ABSTRACT

A fabrication method of VCSEL is used to form a contact electrode on a VCSEL in a resonance cavity. A heavily doped layer is formed in a resonance cavity where the light intensity is the weakest. A Bragg reflector is etched while the etching stop point being above the heavily doped layer. Dopants are doped to form a high-carrier-concentration ohmic channel as a connection between an electrode and the heavily doped layer. Thereby, a contact electrode is formed on the VCSEL structure in the resonance cavity without the need of high etching precision.

4 Claims, 6 Drawing Sheets

VCSEL AND THE FABRICATION METHOD OF THE SAME

This Non-provisional application claims priority under 35 U.S.C. § 119(a) on Patent Application No(s). 092127846 filed in Taiwan on Oct. 7, 2003, the entire contents of which are hereby incorporated by reference.

FIELD OF INVENTION

The present invention relates to a VCSEL and the fabrication method of the same, in particularly, relates to a VCSEL contact electrodes in a resonance cavity, and the fabrication method of the same.

RELATED ART

Optical fiber technology is a core technology for long-distance communication systems. Recently, it has been also applied in short-distance communication systems such as interconnection between systems, or short-distance networks. This progress is achieved via the implementation of a vertical-cavity surface emitting laser (VCSEL). Compared with an edge-emitting laser, the size of the vertical-cavity surface emitting laser is reduced with less power consumption. The greatest benefit of VCSEL is its low fabrication cost. VCSEL can be tested on wafers so that any fail devices can be found before packaging to save the production cost.

Available VCSELs are mainly suitable for short-distance connections, such as boxes apart within 300 meters (or the so called very short distance connection). In future applications, it is prefer to have VCSEL used with longer wavelength and faster operation speed than recent available applications. In the process of manufacturing a conventional VCSEL, a bottom Bragg reflector, a resonance cavity (including waveguide layers, an active region and current-confinement layers) and a top Bragg reflector are sequentially formed by implementing an epitaxy crystal growth method; then, an upper electrode and a bottom electrode are formed to complete the VCSEL. A current flows through the top and bottom Bragg reflectors via the upper and bottom electrodes to load carriers into the active region and thereby generate light. The light resonates between the top and bottom Bragg reflectors and emits laser. Due to the fact that free carrier absorption occurs significantly in long wavelength region, it adversely affects the luminous intensity. Therefore, in a currently available long-wavelength VCSEL, the undoped DBR mirrors are used and the electrodes are made inside the resonance cavity, as disclosed in U.S. Pat. No. 5,245,622. In order to minimize the free carrier absorption, the VCSEL having the above structure usually use undoped DBR mirrors. A n-type and a p-type heavily doped thin layers for ohmic contact are located at the minimums of optical field inside the waveguide layers. However, this heavily doped thin layer has a thickness of only about 20–40 nm, which requires precise etching and subsequent verification steps to ensure that the electrodes are formed in the heavily doped thin layers. This results in a more complex production process.

SUMMARY OF THE INVENTION

In order to solve the problems of the prior art, the present invention provides a VCSEL and the fabrication method of the same. Dopants are diffused to achieve the connection between the electrodes and the heavily doped layers. It eliminates the need of highly precise etching. This not only provides a good ohmic contact between a metal and a semiconductor in a subsequent processing step, but also simplifies the forming process of the contact electrode on the VCSEL in the resonance cavity, thereby greatly increases the yield.

The method of manufacturing a VCSEL of the invention includes forming a contact electrode on a VCSEL structure in a resonance cavity. An undoped Bragg reflector and a resonance cavity containing a heavily doped layer are provided. The heavily doped layers are located at the minimums of optical field inside the waveguide layers under the Bragg reflector. The process is characterized by the fact that the Bragg reflector is etched and the distance between the etching stop point and the heavily doped layer is smaller than a dopant diffusion depth of a subsequently formed high-carrier-concentration ohmic channel. Dopants are doped and diffusing into a predetermined region in order to form a high-carrier-concentration ohmic channel connecting to the heavily doped layer; then the conductive electrode is formed on the predetermined region.

The cost of diffusing the dopants into a layer at a predetermined depth is low and high etching precision is not required. Together with the aforementioned manufacturing processes, the invention further provides a VCSEL structure on a substrate. A bottom Bragg reflector, a resonance cavity including a top heavily doped layer and a bottom heavily doped layer, and a top Bragg reflector are sequentially formed on the substrate. An upper electrode is formed over the top heavily doped layer and connects to the top heavily doped layer via a top high-carrier-concentration ohmic channel. The height of the top high-carrier-concentration ohmic channel is smaller than a diffusion depth of the dopants. The top heavily doped layer has an electrical property opposite to the bottom heavily doped layer. That is, the top heavily doped layer has p-type carriers while the bottom heavily doped layer has n-type carriers.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and in which.

DETAILED DESCRIPTION OF THE INVENTION

Figure 1:
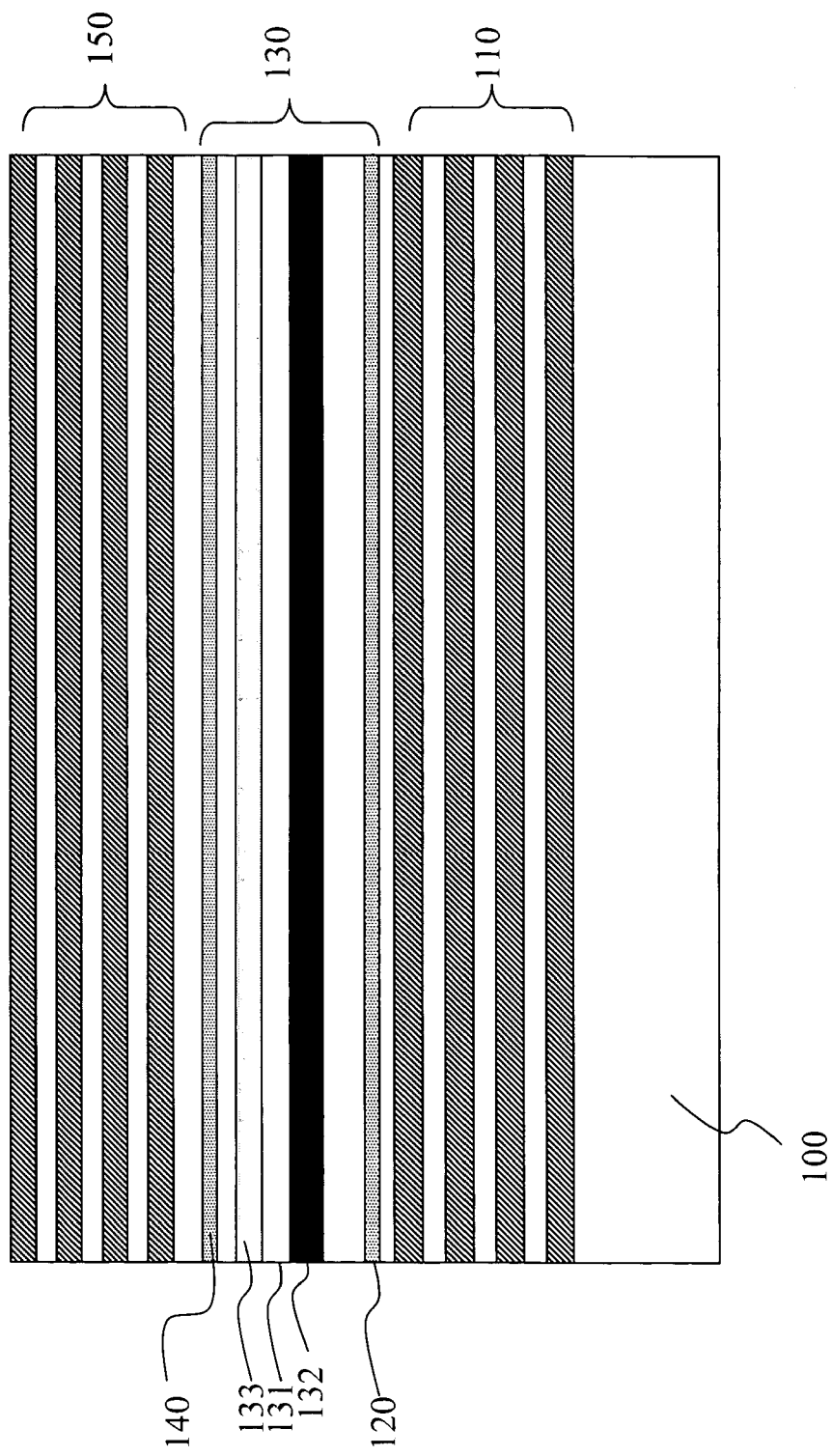
FIG. 1 is a schematic view of an epitaxy structure of a contact electrode in a resonance cavity of a surface-emitting laser according to an embodiment of the invention.

FIG. 1 is a schematic view of an epitaxy structure of a contact electrode in a resonance cavity of a surface-emitting laser according to an embodiment of the invention. In the epitaxy structure, a bottom Bragg reflector 110, a resonance cavity 130, and a top Bragg reflector 150 are epitaxily formed on a substrate 100. The resonance cavity 130 includes an n-type heavily doped layer 120, a wave guide layer 131, an active region 132, a current-confinement layer 133 and a p-type heavily doped layer 140. The bottom Bragg reflector 110 and the top Bragg reflector 150 are respectively formed by semiconductor material of different refractive index. The semiconductor material of the bottom Bragg reflector 110 is lattice-match to the substrate 100. The substrate can be, for example, a GaAs or InP substrate.

Figure 2:
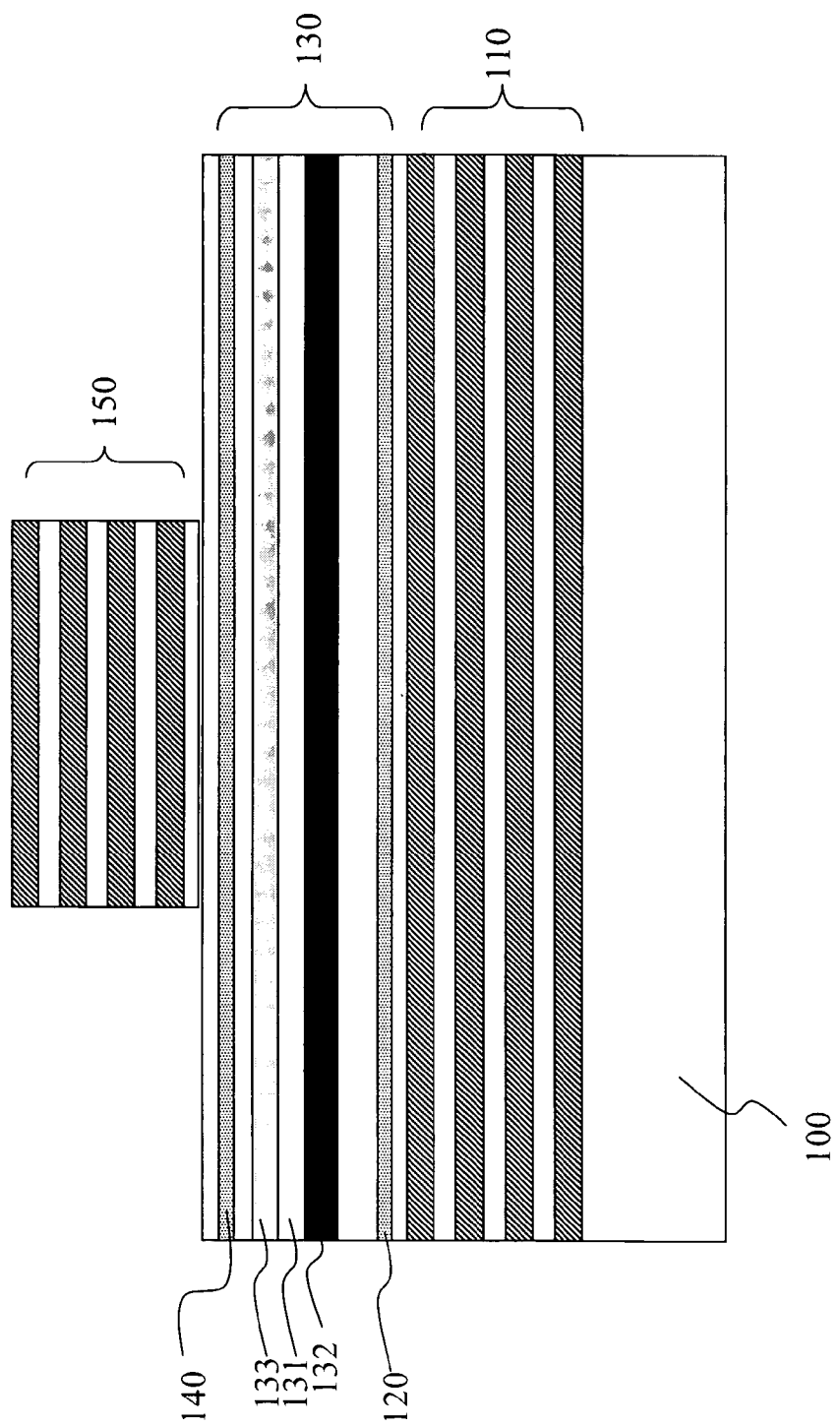
FIG. 2 is a schematic view illustrating the formation of a p-mesa by etching according to an embodiment of the invention.

FIG. 2 is a schematic view illustrating the formation of a p-mesa by etching according to an embodiment of the invention. The top Bragg reflector is etched to form a p-mesa. The distance between the etching stop point and the p-type heavily doped layer 140 is smaller than the diffusion depth of the doping impurities.

Figure 3:
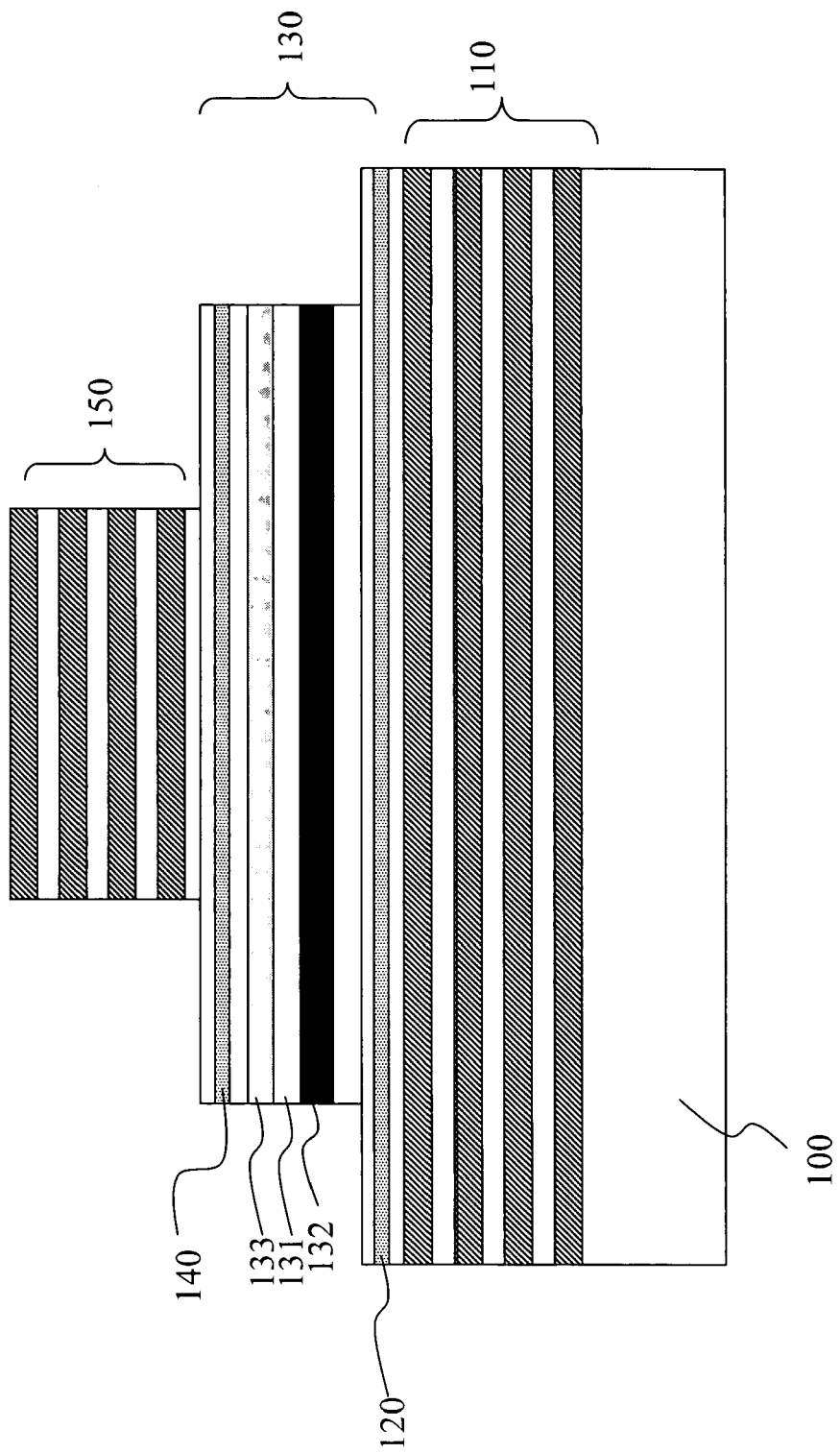
FIG. 3 is a schematic view illustrating the formation of an n-mesa by etching according to an embodiment of the invention.

FIG. 3 is a schematic view illustrating the formation of an n-mesa by etching according to an embodiment of the invention. The n-mesa is wider than the p-mesa.

Figure 4:
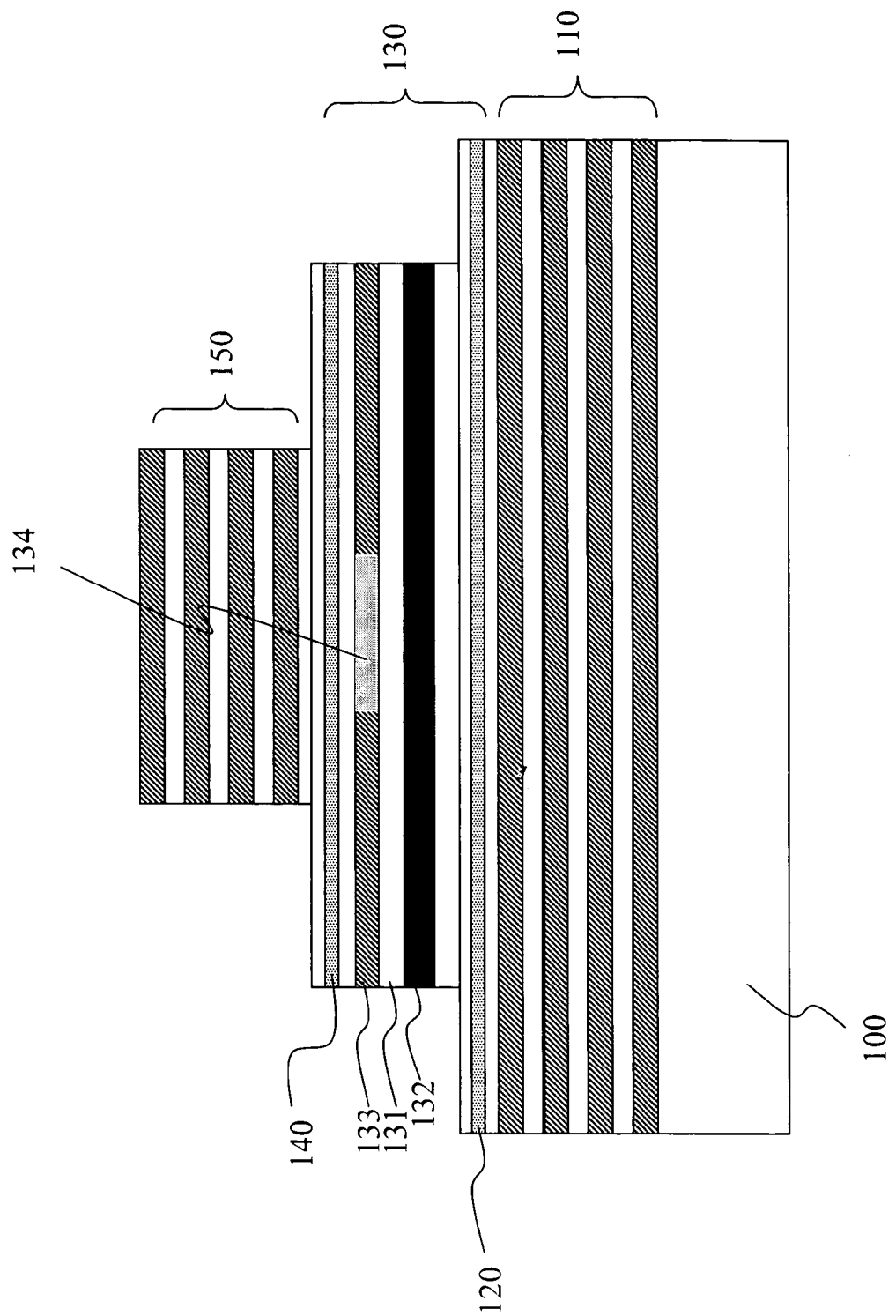
FIG. 4 is a schematic view illustrating the oxidation of a current-confinement layer according to an embodiment of the invention.

FIG. 4 is a schematic view illustrating the oxidation of the current-confinement layer according to an embodiment of the invention. In order to reduce the threshold current of the laser, a current-confinement aperture 134 is formed on the current-confinement layer 133 by wet oxidizing.

Figure 5:
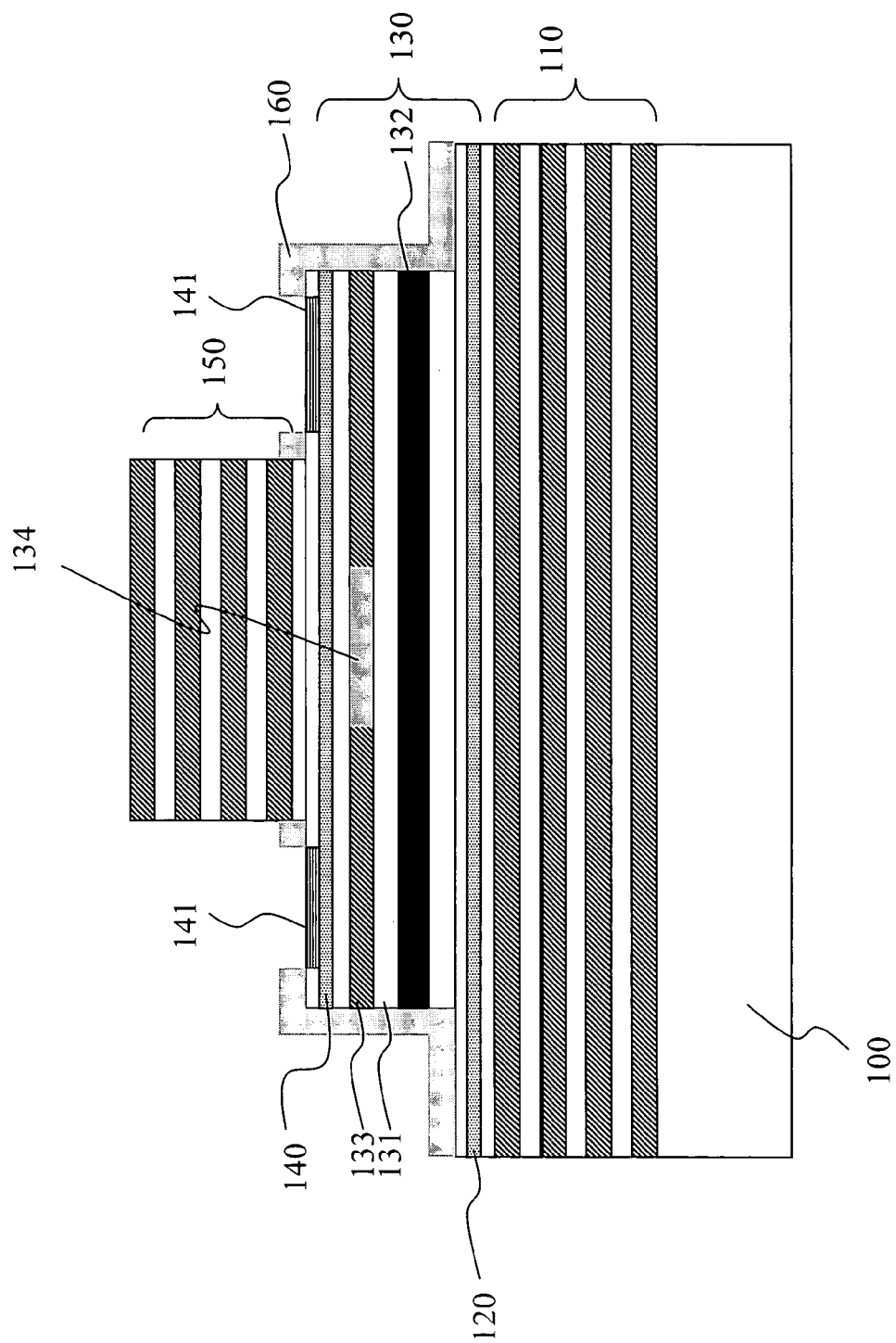
FIG. 5 is a schematic view of the formation of a ohmic contact according to an embodiment of the invention.

FIG. 5 is a schematic view of the formation of an ohmic contact channel. A protective layer is formed to cover the surface-emitting laser structure, which only exposes a predetermined region of a p-type metal electrode. Zinc atoms are diffused into the predetermined region of the metal electrode to form a p-type high-carrier-concentration ohmic contact channel 141 connecting with the p-type heavily doped layer 140.

Figure 6:
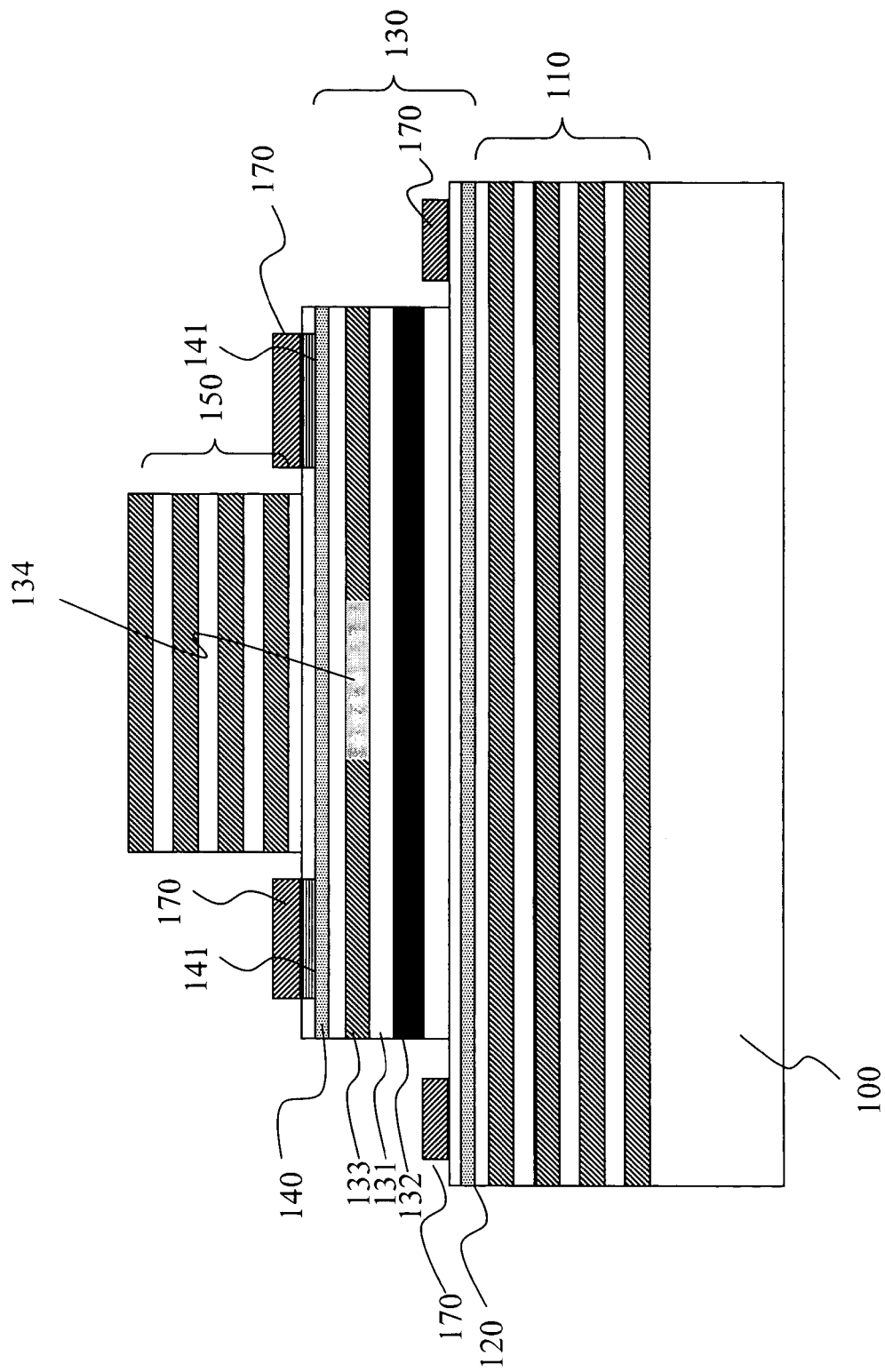
FIG. 6 is a schematic view of the formation of a metal electrode according to an embodiment of the invention.

FIG. 6 is a schematic view of the formation of the metal electrode according to an embodiment of the invention. A metal electrode 170 is plated on the p-type heavily doped layer 140 and the n-type heavily doped layer 120. The p-type metal electrode 170 connects with the p-type heavily doped layer 140 via the p-type high-carrier-concentration ohmic contact channel 141.

Doping elements of the p-type heavily doped layer 140 can be zinc, carbon, beryllium or magnesium. According to the p-type heavily doped layer, the elements used to form the high-carrier-concentration ohmic contact channel can be, for example, zinc, beryllium or magnesium. The dopants for the n-type heavily doped layer can be, for example, silicon. Generally, the required etching precision for the n-mesa is not as high as for the p-mesa. Therefore, connection between the n-type heavily doped layer and the n-type metal electrode does not have to be achieved by the high-carrier-concentration ohmic contact channel. If the n-type high-carrier-concentration ohmic contact channel is to be formed on the n-type heavily doped layer, the elements used to form an n-type high-carrier-concentration ohmic contact channel must have electrical characteristics matching with the n-type heavily doped layer.

With a high-carrier-concentration ohmic contact channel in electrical connection with the metal electrode and the heavily doped layer, high etching precision is not necessarily needed. The high-carrier-concentration ohmic contact channel is completed by thermal diffusion of the doping elements. Annex 1 is a graph describing the relationship between the dopant concentration and the diffusion depth of zinc atoms while the zinc atoms diffuse into a sample with a p-type carrier concentration of $2 \times 10^{18}$ cm$^{-3}$. The resulting observation shows that after thermal diffusion took place, zinc atoms diffuse into the high-carrier-concentration region about 0.2 micro-meters below a top surface thereof. Therefore, due to their diffusion characteristics, dopants are suitable to form a high-carrier-concentration ohmic contact channel on a surface-emitting laser structure with the electrode inside the resonance cavity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fabrication method of VCSEL, implemented to form a contact electrode on a substrate in a resonance cavity, comprising:

subsequently forming a bottom Bragg reflector, a resonance cavity and a top Bragg reflector, wherein the resonance cavity includes a bottom doped layer and a top doped layer, wherein the bottom doped layer has a carrier electrical property opposite to that of the top doped layer;

etching the Bragg reflector, wherein the distance between the etching stop and the top doped layer is smaller than a dopant diffusion depth of a subsequently formed top high-carrier-concentration ohmic contact channel;

diffusing dopants into an upper electrode predetermined region to form a top high-carrier-concentration ohmic contact channel connecting the top doped layer, wherein the dopant electrical property of the top high-carrier-concentration ohmic contact channel is opposite to that of the bottom doped layer;

forming the upper electrode at the predetermined region, wherein the top high-carrier-concentration ohmic contact channel connects to the top doped layer via the upper electrode; and forming a bottom high-carrier-concentration ohmic contact channel, via which the lower electrode is connected to the bottom doped layer.

2. The fabrication method of claim 1, wherein the dopants in the diffusing step are zinc.

3. The fabrication method of claim 1, wherein the dopants of the top doped layer are selected from the group consisting of zinc, carbon, beryllium and magnesium.

4. The fabrication method of claim 1, wherein the dopants of the bottom doped layer are silicon.

* * * * *